US011909088B2

(12) United States Patent
Tago (10) Patent No.: US 11,909,088 B2
(45) Date of Patent: Feb. 20, 2024

(54) TRANSMISSION LINE MEMBER INCLUDING FIRST AND THIRD TRANSMISSION LINE PORTIONS CONNECTED BY A SECOND COPLANAR WAVEGUIDE PORTION OF REDUCED THICKNESS AND GREATER WIDTH (71) Applicant: Murata Manufacturing Co., Ltd., Nagaokakyo (JP)

(72) Inventor: Shigeru Tago, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 311 days.

(21) Appl. No.: 17/335,366

(22) Filed: Jun. 1, 2021

(65) Prior Publication Data
US 2021/0288390 A1 Sep. 16, 2021

Related U.S. Application Data (63) Continuation of application No. PCT/JP2019/049524, filed on Dec. 18, 2019.

(30) Foreign Application Priority Data

Dec. 20, 2018 (JP) .................. 2018-238233

(51) Int. Cl.
*H01P 3/08* (2006.01)
*H05K 1/02* (2006.01)
(Continued)

(52) U.S. Cl.
CPC .............. *H01P 3/082* (2013.01); *H01P 3/003* (2013.01); *H01P 3/081* (2013.01); *H01P 3/088* (2013.01);
(Continued)

(58) Field of Classification Search
CPC .......... H01P 3/082; H01P 3/088; H01P 5/028; H01P 3/003
(Continued)

(56) References Cited

U.S. PATENT DOCUMENTS 9,401,534 B2 * 7/2016 Kato et al. .............. H01P 3/088
2005/0078459 A1 4/2005 Yeon
(Continued)

FOREIGN PATENT DOCUMENTS

JP 2005-123622 A 5/2005
JP 2008-187670 A 8/2008
(Continued)

OTHER PUBLICATIONS

Official Communication issued in International Patent Application No. PCT/JP2019/049524, dated Mar. 10, 2020.

*Primary Examiner* — Benny T Lee
(74) *Attorney, Agent, or Firm* — Keating & Bennett, LLP (57) ABSTRACT

A transmission line member includes a base body extending along a transmission direction of a high-frequency signal, and a first transmission line, a second transmission line, and a third transmission line. The base body includes a first portion including the first transmission line, a second portion including the second transmission line, and a third portion including the third transmission line. The second portion is connected between the first and third portions. A thickness of the second portion is smaller than a thickness of the first and third portions. The second transmission line includes only a conductor pattern extending more in the transmission direction than in a direction of the thickness.

18 Claims, 9 Drawing Sheets

(51) Int. Cl.
  *H01P 3/00* (2006.01)
  *H01P 5/02* (2006.01)
(52) U.S. Cl.
  CPC ............... *H01P 5/028* (2013.01); *H05K 1/02* (2013.01); *H05K 1/028* (2013.01)
(58) Field of Classification Search
  USPC ......................................... 333/238, 33, 246
  See application file for complete search history.

(56) References Cited

U.S. PATENT DOCUMENTS

| | | |
|---|---|---|
| 2009/0029570 A1 | 1/2009 | Ikeuchi et al. |
| 2014/0176266 A1 | 6/2014 | Kato et al. |
| 2015/0130683 A1 | 5/2015 | Kato et al. |

FOREIGN PATENT DOCUMENTS

| | | |
|---|---|---|
| JP | 2012-227632 A | 11/2012 |
| WO | 2013/094471 A1 | 6/2013 |

\* cited by examiner

TRANSMISSION LINE MEMBER INCLUDING FIRST AND THIRD TRANSMISSION LINE PORTIONS CONNECTED BY A SECOND COPLANAR WAVEGUIDE PORTION OF REDUCED THICKNESS AND GREATER WIDTH

CROSS REFERENCE TO RELATED APPLICATIONS

This application claims the benefit of priority to Japanese Patent Application No. 2018-238233 filed on Dec. 20, 2018 and is a Continuation Application of PCT Application No. PCT/JP2019/049524 filed on Dec. 18, 2019. The entire contents of each application are hereby incorporated herein by reference.

BACKGROUND OF THE INVENTION

1. Field of the Invention

The present invention relates to a transmission line member that transmits a high-frequency signal.

2. Description of the Related Art

WO 2013/094471A describes a high-frequency transmission line having a signal conductor and a ground conductor formed in a base material made of insulating resin.

The high-frequency transmission line described in WO 2013/094471A has a stripline, a coplanar line, and a stripline formed in a signal transmission direction.

The base material of the high-frequency transmission line described in WO 2013/094471A has a uniform thickness in the signal transmission direction.

Unfortunately, when the high-frequency transmission line described in WO 2013/094471A is bent to be used, it is difficult to determine the bending position in the extending direction of the base material, which is the signal transmission direction. Depending on the bending position, bending stress is likely to be applied to an interlayer connection conductor formed in the base material.

SUMMARY OF THE INVENTION

Preferred embodiments of the present invention provide transmission line members, each with a bending position that is able to be easily determined, and an impact of the bending stress on internal portions of the transmission line is able to be reduced or prevented.

A transmission line member according to a preferred embodiment of the present invention includes a base body extending along a transmission direction of a high-frequency signal, and a first transmission line, a second transmission line, and a third transmission line that are provided in the base body and are sequentially connected along the transmission direction.

The base body includes a first portion in which the first transmission line is provided, a second portion in which the second transmission line is provided, and a third portion in which the third transmission line is provided. The second portion is connected between the first portion and the third portion. A thickness of the second portion is smaller than a thickness of the first portion and a thickness of the third portion. The second transmission line includes only a conductor pattern extending more in the transmission direction than in a direction of the thickness.

With this configuration, the second portion is more easily bent than the first portion and the third portion. This easily bendable portion includes no interlayer connection conductor extending in the thickness direction of the base body.

With preferred embodiments of the present invention, the bending position is able to be easily determined, and an impact of the bending stress on an internal structure is able to be reduced or prevented.

The above and other elements, features, steps, characteristics and advantages of the present invention will become more apparent from the following detailed description of the preferred embodiments with reference to the attached drawings, wherein like features are denoted by the same reference labels throughout the detailed description of the drawings.

DETAILED DESCRIPTION OF THE PREFERRED EMBODIMENTS

First Preferred Embodiment

Figure 1:
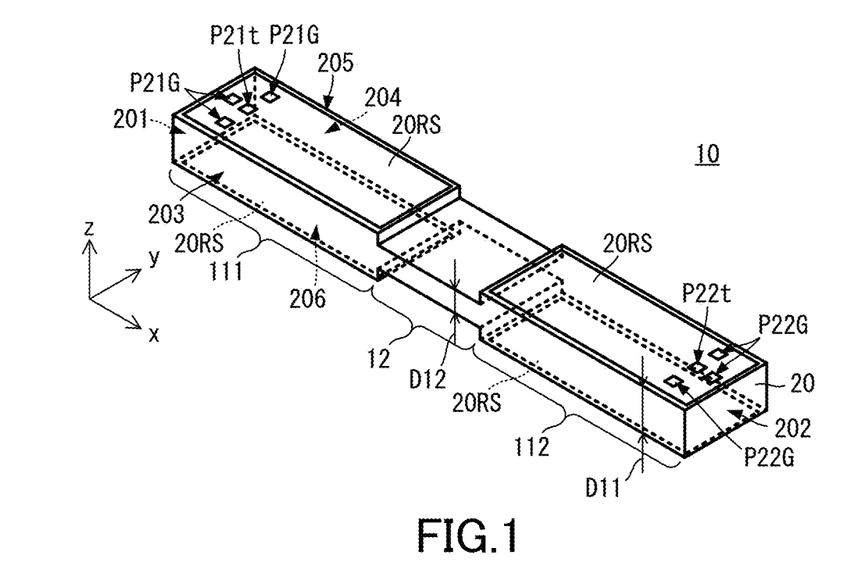
FIG. 1 is an external perspective view of a transmission line member according to a first preferred embodiment of the present invention.

A transmission line member according to a first preferred embodiment of the present invention will be described with reference to the drawings. FIG. 1 is an external perspective view of the transmission line member according to the first preferred embodiment. In FIG. 1, the thickness is exaggerated to facilitate the understanding of the configuration.
Schematic Configuration of Transmission Line Member 10

As illustrated in FIG. 1, a transmission line member 10 includes a base body 20. The base body 20 includes, as a main material, a flexible insulating material. As the main material, for example, liquid crystal polymer, fluorine-based resin, or the like may be used.

The base body 20 extends along a predetermined direction (x direction in FIG. 1: signal transmission direction). The base body 20 includes an end surface 201, an end surface 202, a side surface 203, a side surface 204, a principal surface 205, and a principal surface 206. The end surface 201 and the end surface 202 are orthogonal or substantially orthogonal to the extending direction of the base body 20, and the side surface 203, the side surface 204, the principal surface 205, and the principal surface 206 are surfaces parallel or substantially parallel to the extending direction of the base body 20.

The end surface 201 and the end surface 202 are separated from each other in the extending direction (x direction in FIG. 1), and are connected to each other by the side surface 203, the side surface 204, the principal surface 205, and the principal surface 206. The side surface 203 and the side surface 204 are separated from each other in a direction (y direction in FIG. 1) orthogonal or substantially orthogonal to the extending direction, and are connected to each other by the principal surface 205 and the principal surface 206. A direction in which the side surface 203 and the side surface 204 are connected to each other (y direction in FIG. 1) is a width direction of the base body 20. The principal surface 205 and the principal surface 206 are separated from each other in a direction (z direction in FIG. 1) orthogonal or substantially orthogonal to the extending direction. A direction in which the principal surface 205 and the principal surface 206 are connected to each other (z direction in FIG. 1) is a thickness direction of the base body 20.

The base body 20 includes a first portion 111, a second portion 12, and a third portion 112 along the extending direction. Along the extending direction of the base body 20, the first portion 111 is a portion of the base body 20 on the end surface 201 side, and the third portion 112 is a portion of the base body on the end surface 202 side. The second portion 12 is between the first portion 111 and the third portion 112, and connects the first portion 111 and the third portion 112 to each other.

A thickness D12 of the second portion 12 is smaller than a thickness D11 of the first portion 111 and the third portion 112. Therefore, the second portion 12 is more easily bent than the first portion 111 and the third portion 112. As a result, the user can easily determine the second portion 12 to be the bending portion, and the transmission line member 10 is used while being bent at the second portion 12.

The base body 20 includes a first transmission line, a second transmission line, and a third transmission line, as will be described in detail later. The first transmission line is provided in the first portion 111, the second transmission line is provided in the second portion 12, and the third transmission line is provided in the third portion 112. Thus, the first transmission line, the second transmission line, and the third transmission line are sequentially connected along the signal transmission direction.

The first transmission line and the third transmission line are striplines, and the second transmission line is a coplanar line. The characteristic impedance of the first transmission line, the characteristic impedance of the second transmission line, and the characteristic impedance of the third transmission line are the same. In other words, the impedance is matched. Note that, the term "same" as used herein includes not only the complete matching but also include matching within an error range.

With the coplanar line used for the second transmission line, the second portion 12 requires no conductor pattern (interlayer connection conductor) extending in the thickness direction. With this configuration, even when the second portion 12 is bent, the conductor pattern that is structured to be more likely to be damaged and extends in the thickness direction would not be damaged in the second portion 12 due to the bending stress.

An interlayer connection conductor is preferably used for the first transmission line and the third transmission line that are striplines, in terms of reducing or preventing radiation to outside of the transmission line member 10 and of noise from outside of the transmission line member 10. Thus, the interlayer connection conductor is preferably used for the first portion 111 and the third portion 112. According to the structure of the transmission line member 10, the first portion 111 and the third portion 112 are not bent, and thus the interlayer connection conductors can be protected from stress due to bending.

Figure 2:
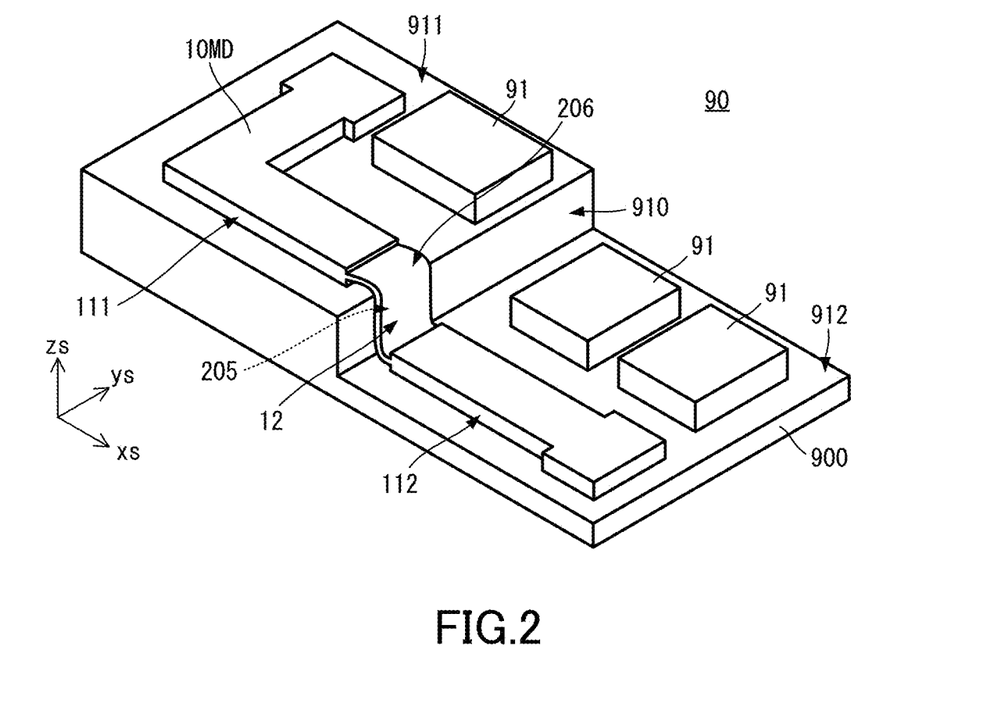
FIG. 2 is an external perspective view of an electronic device including the transmission line member according to the first preferred embodiment of the present invention.

The transmission line member 10 having such a configuration is used in, for example, an electronic device as illustrated in FIG. 2. FIG. 2 is an external perspective view of an electronic device including the transmission line member according to the first preferred embodiment. In FIG. 2, the first portion 111 of the transmission line member 10MD is bent in a plane parallel or substantially parallel to the principal surface, but the basic configuration is the same as or similar to that of the transmission line member 10 that is not bent, as shown in FIG. 1.

As illustrated in FIG. 2, an electronic device 90 includes a transmission line member 10MD, a mounted electronic component 91, and a circuit board 900.

The circuit board 900 has a thickness direction (zs direction in FIG. 2), a length direction (xs direction in FIG. 2), and a width direction (ys in FIG. 2) and includes a principal surface 911 and a principal surface 912 at different positions in the thickness direction (zs direction in FIG. 2). The circuit board 900 further includes a step surface 910 that connects the principal surface 911 and the principal surface 912 to each other and is parallel or substantially parallel to the thickness direction.

The mounted electronic component 91 is mounted on the principal surface 911 or the principal surface 912.

The first portion 111 of the transmission line member 10MD is directly mounted on the principal surface 911 by solder or the like, for example. The third portion 112 of the transmission line member 10MD is directly mounted on the principal surface 912 by solder or the like.

The second portion 12 of the transmission line member 10MD is bent toward the principal surface 205 in a direction (thickness direction) orthogonal or substantially orthogonal to the principal surface 205 and the principal surface 206 in the vicinity of the first portion 111. The second portion 12 of the transmission line member 10MD is bent toward the principal surface 206 in a direction (thickness direction) orthogonal or substantially orthogonal to the principal surface 205 and the principal surface 206 in the vicinity of the third portion 112. Thus, the transmission line member 10MD is orthogonal or substantially orthogonal to the principal surface 205 and the principal surface 206 at different positions in the extending direction, and is bent in a plurality of different directions. With this configuration, the second portion 12 of the transmission line member 10MD is parallel or substantially parallel to the step surface 910.

Thus, by using the second portion 12, which is easily bendable, as a bending portion, the transmission line member 10MD can be easily arranged even when there is a level difference between the principal surface 911 and the principal surface 912 of the circuit board 900. Furthermore, the impact on the internal structure due to the bending stress on the transmission line member 10MD can be reduced or prevented, such that the reliability of the transmission line member 10MD is improved.

As illustrated in FIG. 1, the principal surface 205 of the base body 20 is provided with an external connection terminal P21t, an external connection terminal P22t, a plurality of external ground terminals P21G, and a plurality of external ground terminals P22G. These terminals are openings of a resist film 20RS provided to the principal surface 205 of the base body 20.

The external connection terminal P21t and the plurality of external ground terminals P21G are disposed in the vicinity of the end surface 201, in the first portion 111. The external connection terminal P22t and the plurality of external ground terminals P22G are disposed in the vicinity of the end surface 202, in the third portion 112.

As described above, in the transmission line member 10, the connection terminal to the external circuit board or the like is provided in a portion that is difficult to bend, such that reliability of connection with the external circuit board or the like is improved.

The external connection terminal P21t and the plurality of external ground terminals P21G may be connected to a connector (not illustrated), and connected to an external circuit board or the like via the connector. Similarly, the external connection terminal P22t and the plurality of external ground terminals P22G may be connected to a connector (not illustrated), and connected to an external circuit board or the like via the connector.

Specific Configuration of Transmission Line Member 10

Figure 3A:
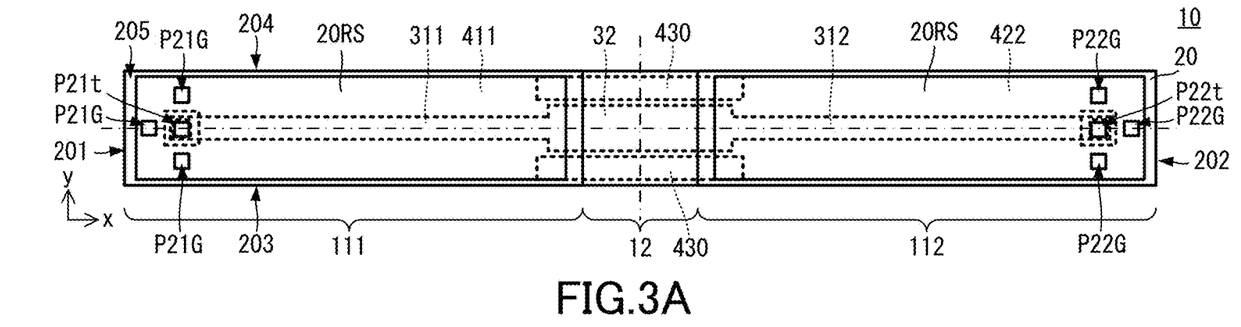
FIG. 3A is a plan view of a first principal surface of the transmission line member according to the first preferred embodiment of the present invention.
Figure 3B:
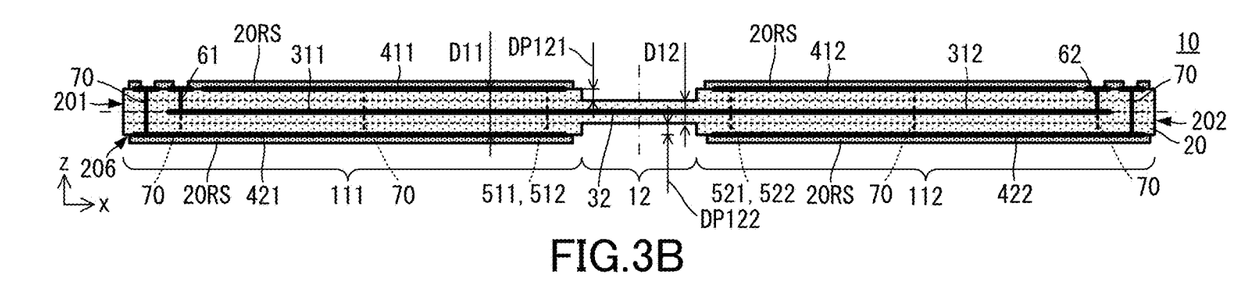
FIG. 3B is a side cross-sectional view of the transmission line member according to the first preferred embodiment of the present invention.
Figure 3C:
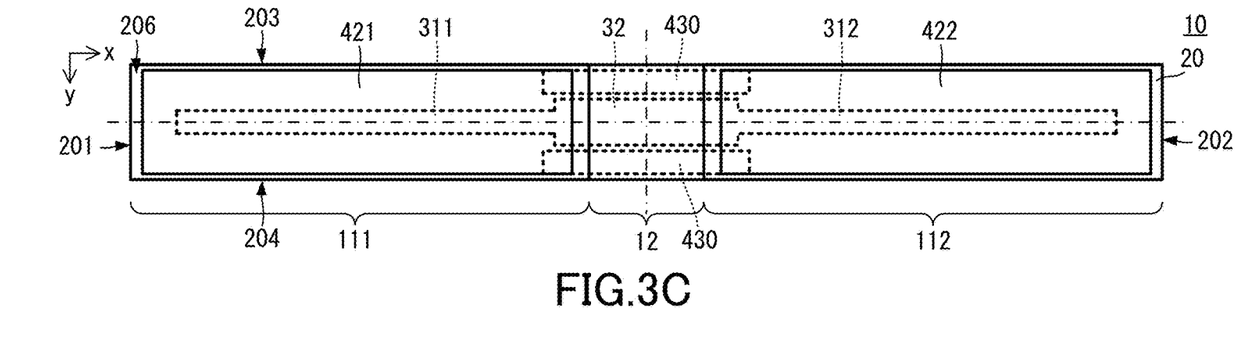
FIG. 3C is a plan view of a second principal surface of the transmission line member according to the first preferred embodiment of the present invention.
Figure 4:
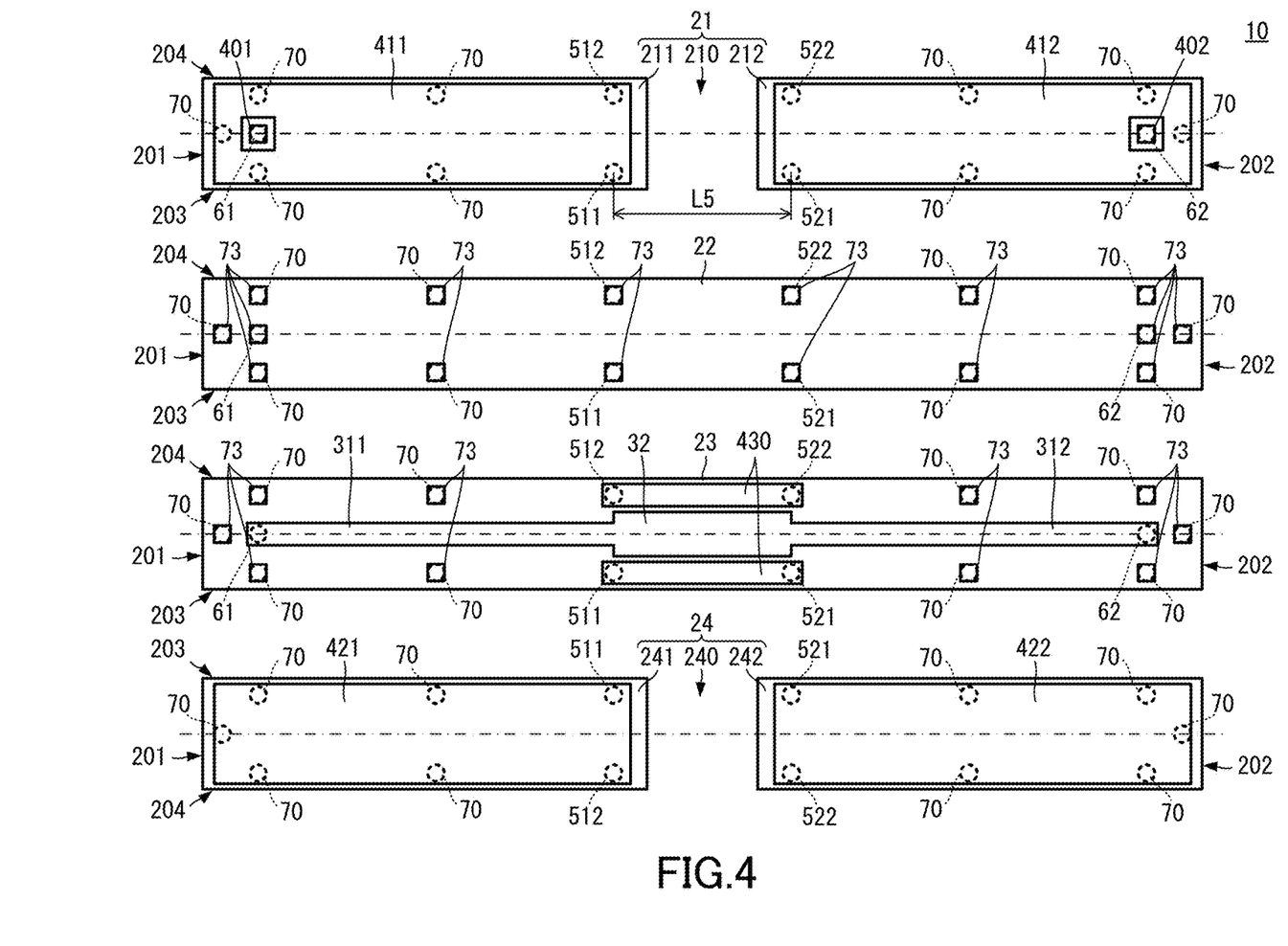
FIG. 4 is an exploded plan view of a base material of a transmission line member according to the first preferred embodiment of the present invention.

FIG. 3A is a plan view of a first principal surface of the transmission line member according to the first preferred embodiment. FIG. 3B is a side cross-sectional view of the transmission line member according to the first preferred embodiment. FIG. 3C is a plan view of a second principal surface of the transmission line member according to the first preferred embodiment. FIG. 4 is an exploded plan view of the base material of the transmission line member according to the first preferred embodiment. In FIGS. 3A to 3C and 4, the thickness is exaggerated to facilitate the understanding of the configuration. The resist film 20RS is omitted from the illustration in FIG. 3C.

The base body 20, as illustrated in FIGS. 3A to 3C, includes a plurality of insulating resin layers 21, 22, 23, and 24 as illustrated in FIG. 4. The plurality of insulating resin layers 21, 22, 23, and 24 are flat films that are longer in one direction and shorter in another direction. The one direction corresponds to the extending direction of the base body 20 described above, and the other direction corresponds to the width direction of the base body 20 described above.

The plurality of insulating resin layers 21, 22, 23, and 24 include flexible thermoplastic resin as a main material. For example, the plurality of insulating resin layers 21, 22, 23, and 24 may include liquid crystal polymer, fluorine-based resin, or the like as a main material. Note that the various conductors described below are made of a highly conductive material, such as copper, for example.

The plurality of insulating resin layers 21, 22, 23, and 24 are laminated in a direction orthogonal or substantially orthogonal to the respective principal surfaces. With this configuration, the base body 20 is a laminate in which the insulating resin layer 21, the insulating resin layer 22, the insulating resin layer 23, and the insulating resin layer 24 are provided in this order from the side of the principal surface 205 to the side of the principal surface 206.

The insulating resin layer 21 is divided into an insulating resin layer 211 and an insulating resin layer 212 in the extending direction. Thus, a gap 210 is provided between the insulating resin layer 211 and the insulating resin layer 212 in the arrangement direction. The thickness of the insulating resin layer 211 and the thickness of the insulating resin layer 212 are the same or substantially the same.

The insulating resin layer 22 and the insulating resin layer 23 are single sheets without a gap.

The insulating resin layer 24 is divided into an insulating resin layer 241 and an insulating resin layer 242 in the extending direction. Thus, a gap 240 is provided between the insulating resin layer 241 and the insulating resin layer 242 in the arrangement direction. The thickness of the insulating resin layer 241 and the thickness of the insulating resin layer 242 are the same or substantially the same.

With this configuration, the base body 20 includes the first portion 111, the second portion 12, and the third portion 112 along the extending direction. The first portion 111 is a laminate including the insulating resin layer 211, the insulating resin layer 22, the insulating resin layer 23, and the insulating resin layer 241. The second portion 12 is a laminate including the insulating resin layer 22 and the insulating resin layer 23. The third portion 112 is a laminate including the insulating resin layer 212, the insulating resin layer 22, the insulating resin layer 23, and the insulating resin layer 242. With this configuration, the thickness D12 of the second portion 12 is smaller than the thickness D11 of the first portion 111 and the third portion 112. Thus, the base body 20 has the above described structure that is easily bendable at the second portion 12.

A ground conductor 411 is provided on one principal surface (the principal surface 205 of the base body 20) of the insulating resin layer 211. The ground conductor 411 covers the entire or substantially the entire surface of the one principal surface of the insulating resin layer 211. An external terminal conductor 401 is in the vicinity of the end surface 201, in the one principal surface of the insulating resin layer 211. The external terminal conductor 401 has a rectangular or substantially rectangular shape, and is provided in an opening (conductor non-forming region) in the ground conductor 411 while being separated from the ground conductor 411. A portion where the external terminal conductor 401 is exposed by the opening of the resist film 20RS is the external connection terminal P21t. A portion where the ground conductor 411 is exposed by the opening of the resist film 20RS is the external ground terminal P21G.

A ground conductor 412 is provided on one principal surface of the insulating resin layer 212. The ground conductor 412 covers the entire or substantially the entire surface of the one principal surface of the insulating resin layer 212. An external terminal conductor 402 is in the vicinity of the end surface 202 in the one principal surface of the insulating resin layer 212. The external terminal conductor 402 has a rectangular or substantially rectangular shape, and is provided in an opening (conductor non-forming region) in the ground conductor 412 while being separated from the ground conductor 412. A portion where the external terminal conductor 402 is exposed by the opening of the resist film 20RS is the external connection terminal P22t. A portion where the ground conductor 412 is exposed by the opening of the resist film 20RS is the external ground terminal P22G. The ground conductor 411 and the ground conductor 412 correspond to a "first ground conductor".

A plurality of connection auxiliary conductors 73 are provided on one principal surface of the insulating resin layer 22 (principal surface of the base body 20 on the side of the principal surface 205). The plurality of connection auxiliary conductors 73 are rectangular or substantially rectangular conductor patterns defining interlayer connection conductors described later.

A signal conductor 311, a signal conductor 312, a signal conductor 32, a plurality of ground conductors 430, and the plurality of connection auxiliary conductors 73 are provided on one principal surface of the insulating resin layer 23 (principal surface of the base body 20 on the side of the principal surface 205). The signal conductor 311, the signal conductor 312, and the signal conductor 32 are linear conductor patterns extending along the extending direction of the base body 20 and having a predetermined width. The plurality of ground conductors 430 correspond to a "third ground conductor" and a "fourth ground conductor". The position of the one principal surface of the insulating resin layer 23 is a predetermined position in the thickness direction in the present preferred embodiment.

The signal conductor 311 is provided in the first portion 111, the signal conductor 32 is provided in the second portion 12, and the signal conductor 312 is provided in the third portion 112. The signal conductor 311 and the signal conductor 312 correspond to a "first signal conductor". The signal conductor 32 corresponds to a "second signal conductor".

One end of the signal conductor 311 in the extending direction is in the vicinity of the end surface 201 of the base body 20 and overlaps with the external terminal conductor 401 in plan view of the base body 20 (as viewed in a direction orthogonal to the principal surface 205 and the principal surface 206). The other end of the signal conductor 311 in the extending direction is connected to one end of the signal conductor 32 in the extending direction. The other end of the signal conductor 32 in the extending direction is connected to one end of the signal conductor 312 in the extending direction. The other end of the signal conductor 312 in the extending direction is in the vicinity of the end surface 202 of the base body 20 and overlaps with the external terminal conductor 402 in plan view of the base body 20.

The width of the signal conductor 32 is larger than the width of the signal conductor 311 and the width of the signal conductor 312 and the widths are in a predetermined relationship.

The plurality of ground conductors 430 are provided in the second portion 12. The plurality of ground conductors 430 sandwich the signal conductor 32 in the width direction of the base body 20. The plurality of ground conductors 430 and the signal conductor 32 are separated from each other, with a distance therebetween set to be a predetermined length. The plurality of ground conductors 430 include one ends in the extending direction protruding into the first portion 111 by a predetermined length, and include the other ends protruding into the third portion 112 by a predetermined length.

A ground conductor 421 is provided on the other principal surface (the principal surface 206 of the base body 20) of the insulating resin layer 241. The ground conductor 421 covers the entire or substantially the entire surface of the other principal surface of the insulating resin layer 241. A ground conductor 422 is provided on the other principal surface of the insulating resin layer 242. The ground conductor 422 covers the entire or substantially the entire surface of the other principal surface of the insulating resin layer 242. The ground conductor 421 and the ground conductor 422 correspond to a "second ground conductor".

The external terminal conductor 401 and the signal conductor 311 are connected to each other by the interlayer connection conductor 61 provided in the insulating resin layer 211 and in the insulating resin layer 22 (more specifically, by the interlayer connection conductor 61 and the connection auxiliary conductor 73 connected thereto).

The external terminal conductor 402 and the signal conductor 312 are connected to each other by an interlayer connection conductor 62 provided in the insulating resin layer 212 and in the insulating resin layer 22 (more specifically, by the interlayer connection conductor 62 and the connection auxiliary conductor 73 connected thereto).

The ground conductor 430 adjacent to the side surface 203 is connected to the ground conductor 411 and the ground conductor 421 by an interlayer connection conductor 511 (more specifically, by the interlayer connection conductor 511 and the connection auxiliary conductor 73 connected thereto). The interlayer connection conductor 511 is provided in a laminate portion including the insulating resin layer 211, the insulating resin layer 22, the insulating resin layer 23, and the insulating resin layer 241, that is, in a thick portion.

The ground conductor 430 adjacent to the side surface 203 is connected to the ground conductor 412 and the ground conductor 422 by an interlayer connection conductor 521 (more specifically, by the interlayer connection conductor 521 and the connection auxiliary conductor 73 connected thereto). The interlayer connection conductor 521 is provided in a laminate portion including the insulating resin layer 212, the insulating resin layer 22, the insulating resin layer 23, and the insulating resin layer 242, that is, in a thick portion.

The ground conductor 430 adjacent to the side surface 204 is connected to the ground conductor 411 and the ground conductor 421 by an interlayer connection conductor 512 (more specifically, by the interlayer connection conductor 512 and the connection auxiliary conductor 73 connected thereto). The interlayer connection conductor 512 is provided in a laminate portion including the insulating resin layer 211, the insulating resin layer 22, the insulating resin layer 23, and the insulating resin layer 241, that is, in a thick portion.

The ground conductor 430 adjacent to the side surface 204 is connected to the ground conductor 412 and the ground conductor 422 by an interlayer connection conductor 522 (more specifically, by the interlayer connection conductor 522 and the connection auxiliary conductor 73 connected thereto). The interlayer connection conductor 522 is provided in a laminate portion including the insulating resin layer 212, the insulating resin layer 22, the insulating resin layer 23, and the insulating resin layer 242, that is, in a thick portion.

The ground conductor 411 and the ground conductor 421 are connected to each other by a plurality of interlayer connection conductors 70 (more specifically, the plurality of interlayer connection conductors 70 and the plurality of connection auxiliary conductors 73 connected thereto). The ground conductor 412 and the ground conductor 422 are connected to each other by a plurality of interlayer connection conductors 70 (more specifically, the plurality of interlayer connection conductors 70 and the plurality of connection auxiliary conductors 73 connected thereto).

With such a configuration, the transmission line member 10 includes, in the first portion 111 of the base body 20, a stripline having a structure in which the signal conductor 311 is sandwiched between the ground conductor 411 and the ground conductor 421 in the thickness direction.

The transmission line member 10 includes, in the second portion 12 of the base body 20, a coplanar line having a structure in which the signal conductor 32 is sandwiched by the plurality of ground conductors 430 in the width direction.

The transmission line member 10 includes, in the third portion 112 of the base body 20, a stripline having a structure in which the signal conductor 312 is sandwiched between the ground conductor 412 and the ground conductor 422 in the thickness direction.

With a predetermined value set for the width of the signal conductor 32 and for the relationship between the signal conductor 32 and the ground conductors 430 as described above, the characteristic impedance of the coplanar line and the characteristic impedance of the stripline can match each other. With this configuration, mismatch in impedance between different lines can be reduced or prevented. Thus, the transmission line member 10 achieves a low transmission loss and thus achieves excellent transmission characteristics.

With the coplanar structure, the distance between the signal conductor 32 and the ground conductors 430 is less likely to change and thus the impedance is less likely to change even when the second portion 12 of the base body 20 is bent due to the application of the bending stress. With the stripline provided in the first portion 111 and the third portion 112, unwanted radiation can be reduced or prevented, such that propagation of noise to an adjoining circuit and the mounted electronic component 91 provided in the circuit board 900 (FIG. 2), for example, can be reduced or prevented.

With the above configuration, the second portion 12 includes no interlayer connection conductor extending therein, and includes the signal conductor 32 and the ground conductor 430 extending along the extending direction of the base body 20. Thus, the application of the bending stress on the interlayer connection conductor can be reduced or prevented, such that the reliability of the transmission line member 10 is improved.

In this configuration, the insulating resin layer 21 and the insulating resin layer 24 have the same or substantially the same thickness. As a result, a recess depth DP121 and a recess depth DP122 of the second portion 12, respectively on the principal surface 205 side and the principal surface 206 side, with respect to the first portion 111 and the third portion 112, are the same or substantially the same. The signal conductor 32 is disposed at the center or approximate of the second portion 12 in the thickness direction. With this configuration, the bending stress related to the signal conductor 32 can be reduced. Thus, the reliability of the transmission line member 10 is further improved.

In this configuration, a distance L5 between the interlayer connection conductor 511 and the interlayer connection conductor 521 (a distance between the interlayer connection conductor 512 and the interlayer connection conductor 522) is preferably, for example, about ¼ or less of the wavelength A of the high-frequency signal transmitted by the transmission line member 10. The interlayer connection conductors 511 and 521 correspond to the "interlayer connection conductor at a position, in the first portion, closest to the second portion", and the interlayer connection conductors 512 and 522 correspond to the "interlayer connection conductor at a position, in the third portion, closest to the second portion". With this configuration, it is possible to reduce or prevent unwanted radiation of the high-frequency signal, transmitted through the transmission line member 10, to outside of the transmission line member 10 in the second portion 12. In particular, the second portion 12 includes no ground conductor in the thickness direction of the base body 20, and thus is likely to involve occurrence of the unwanted radiation. Still, with the distance L5 between the interlayer connection conductor 511 and the interlayer connection conductor 521 (the distance between the interlayer connection conductor 512 and the interlayer connection conductor 522) being about ¼ or less of the wavelength A of the high-frequency signal, the standing wave due to resonance can have a small amplitude, so that the impact thereof can be small. Note that the high-frequency signal referred to herein is, for example, a signal having a frequency of about 300 MHz or higher.

The plurality of interlayer connection conductors 70 in the first portion 111 and the third portion 112 are also preferably arranged at an interval of, for example, about ¼ or less of the wavelength A of the high-frequency signal in the extending direction of the base body 20. With this configuration, unwanted radiation to outside of the transmission line member 10 can be reduced or prevented even in the stripline.

Second Preferred Embodiment

Figure 5:
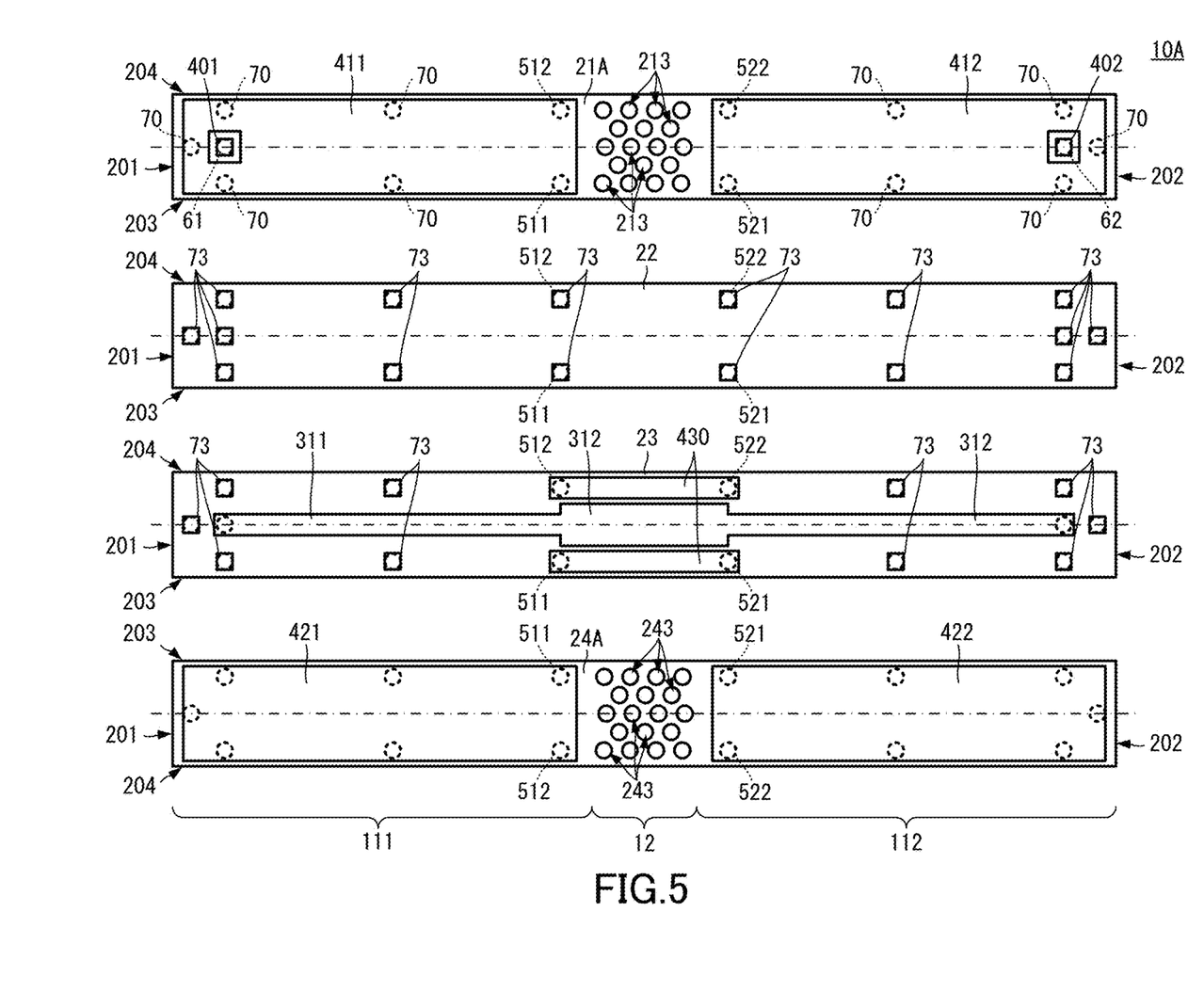
FIG. 5 is an exploded plan view of a base material of a transmission line member according to a second preferred embodiment of the present invention.

A transmission line member according to a second preferred embodiment of the present invention will be described with reference to the drawings. FIG. 5 is an exploded plan view of the base material of the transmission line member according to the second preferred embodiment. In FIG. 5, the thickness is exaggerated to facilitate the understanding of the configuration.

As illustrated in FIG. 5, a transmission line member 10A according to the second preferred embodiment is different from the transmission line member 10 according to the first preferred embodiment in that an insulating resin layer 21A and an insulating resin layer 24A are provided. The remaining configurations of the transmission line member 10A are the same as or similar to those of the transmission line member 10, and the description of the same or similar portions will be omitted.

As illustrated in FIG. 5, the transmission line member 10A has a laminated structure including the insulating resin layer 21A, the insulating resin layer 22, the insulating resin layer 23, and the insulating resin layer 24A in the second portion 12.

A plurality of through holes 213 are provided in the second portion 12 of the insulating resin layer 21A. As a result, the average thickness of the second portion 12 of the insulating resin layer 21A is smaller than the thickness of the first portion 111 and the thickness of the third portion 112 of the insulating resin layer 21A. Thus, the substantial thickness of the second portion 12 of the insulating resin layer 21A is smaller than the thickness of the first portion 111 and the thickness of the third portion 112 of the insulating resin layer 21A.

A plurality of through holes 243 are provided in the second portion 12 of the insulating resin layer 24A. As a result, the average thickness of the second portion 12 of the insulating resin layer 24A is smaller than the thickness of the first portion 111 and the thickness of the third portion 112 of the insulating resin layer 24A. Thus, the substantial thickness of the second portion 12 of the insulating resin layer 24A is smaller than the thickness of the first portion 111 and the thickness of the third portion 112 of the insulating resin layer 24A.

With this configuration, in the transmission line member 10A, the substantial thickness of the second portion 12 is smaller than the thickness of the first portion 111 and the thickness of the third portion 112. As a result, in the transmission line member 10A, the second portion 12 can be used as the bending portion as in the transmission line member 10.

Third Preferred Embodiment

Figure 6A:
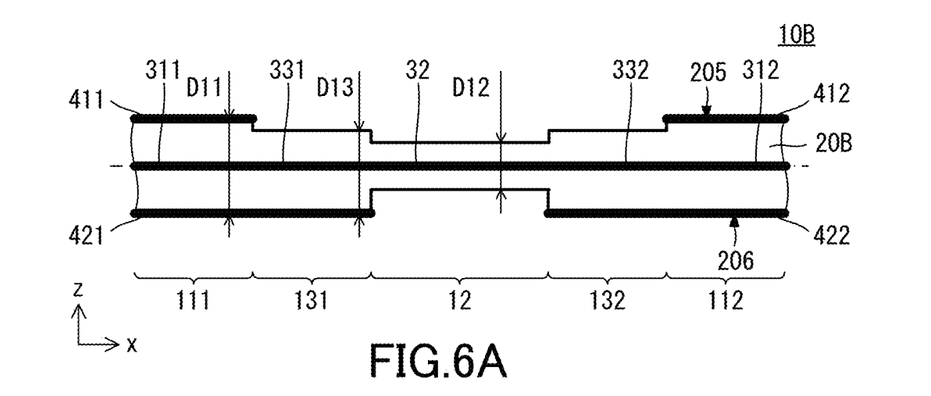
FIG. 6A is an enlarged side cross-sectional view of a region of a transmission line member according to a third preferred embodiment of the present invention including a second portion of a base material.
Figure 6B:
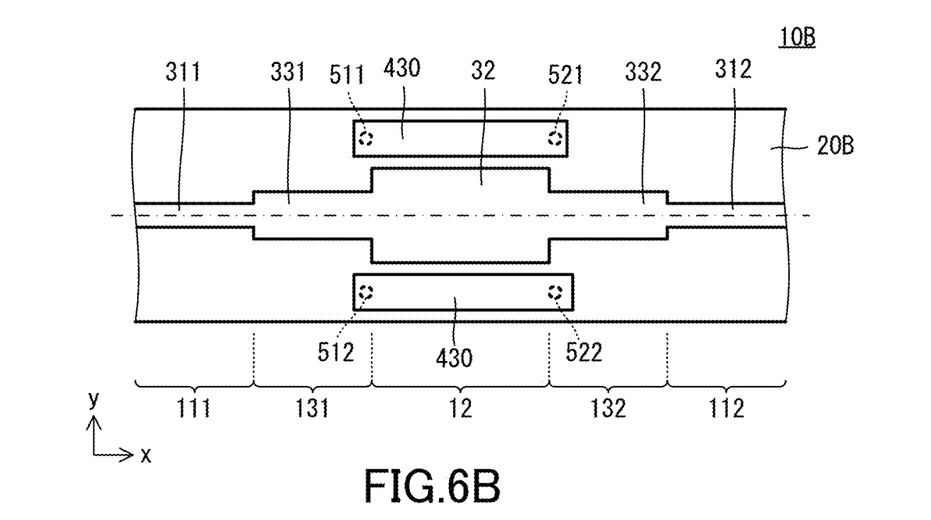
FIG. 6B is an enlarged plan view of the region of the transmission line member according to the third preferred embodiment of the present invention including the second portion of the base material.

A transmission line member according to a third preferred embodiment of the present invention will be described with reference to the drawings. FIG. 6A is an enlarged side cross-sectional view of a region including the second portion of the base material of the transmission line member according to the third preferred embodiment. FIG. 6B is an enlarged plan view of the region including the second portion of the base material of the transmission line member according to the third preferred embodiment. In FIG. 6A, the thickness is exaggerated to facilitate the understanding of the configuration.

As illustrated in FIGS. 6A and 6B, a transmission line member 10B according to the third preferred embodiment is different from the transmission line member 10 according to the first preferred embodiment in that a fourth portion 131 and a fifth portion 132 are provided. The remaining configurations of the transmission line member 10B are the same as or similar to those of the transmission line member 10, and the description of the same or similar portions will be omitted.

The transmission line member 10B includes the fourth portion 131 and the fifth portion 132.

The fourth portion 131 includes a signal conductor 331 and the ground conductor 421. The signal conductor 331 and the ground conductor 421 are separated from each other and face each other in the thickness direction of the base body 20B. Thus, a microstripline is provided in the fourth portion 131.

The signal conductor 331 is connected to the signal conductor 311. The ground conductor 421 is common to the stripline of the first portion 111. Thus, the microstripline of the fourth portion 131 is connected to the stripline of the first portion 111. The signal conductor 331 corresponds to a "third signal conductor". A portion of the ground conductor 421 facing the signal conductor 331 corresponds to a "fifth ground conductor".

The signal conductor 331 is connected to the signal conductor 32, and the ground conductor 421 is connected to the ground conductor 430 via the interlayer connection conductor 511 and the interlayer connection conductor 512. As a result, the microstripline of the fourth portion 131 is connected to the coplanar line of the second portion 12.

The fourth portion 131 is recessed on the side of the principal surface 205. Thus, a thickness D13 of the fourth portion 131 is smaller than the thickness D11 of the first portion 111. The thickness D13 is larger than the thickness D12 of the second portion 12.

The fifth portion 132 includes a signal conductor 332 and the ground conductor 422. The signal conductor 332 and the ground conductor 422 are separated from each other and face each other in the thickness direction of the base body 20B. Thus, a microstripline is provided in the fifth portion 132.

The signal conductor 332 is connected to the signal conductor 312. The ground conductor 422 is common to the stripline of the third portion 112. Thus, the microstripline of fifth portion 132 is connected to the stripline of the third portion 112. The signal conductor 332 corresponds to a "third signal conductor". A portion of the ground conductor 422 facing the signal conductor 332 corresponds to the "fifth ground conductor".

The signal conductor 332 is connected to the signal conductor 32, and the ground conductor 422 is connected to the ground conductor 430 via the interlayer connection conductor 521 and the interlayer connection conductor 522. As a result, the microstripline of the fifth portion 132 is connected to the coplanar line of the second portion 12.

The fifth portion 132 is recessed on the side of the principal surface 205. Thus, the thickness D13 of the fifth portion 132 is smaller than the thickness D11 of the third portion 112. The thickness D13 is larger than the thickness D12 of the second portion 12.

The width of the signal conductor 331 and the width of the signal conductor 332 are larger than the width of the signal conductor 311 and the width of the signal conductor 312. The width of the signal conductor 331 and the width of the signal conductor 332 are smaller than the width of the signal conductor 32. With this configuration, the characteristic impedance of the striplines of the first portion 111 and the third portion 112, the characteristic impedance of the coplanar line of the second portion 12, and the characteristic impedance of the microstriplines of the fourth portion 131 and the fifth portion 132 can match one another. Therefore, the transmission loss of the transmission line member 10B is reduced or prevented and the transmission characteristics improved.

In addition, concentration of stress due to a sudden change in thickness can be reduced or prevented. Thus, a risk of damage, such as peeling, for example, due to bending stress can be reduced. Furthermore, impedance can be easily adjusted.

Fourth Preferred Embodiment

Figure 7:
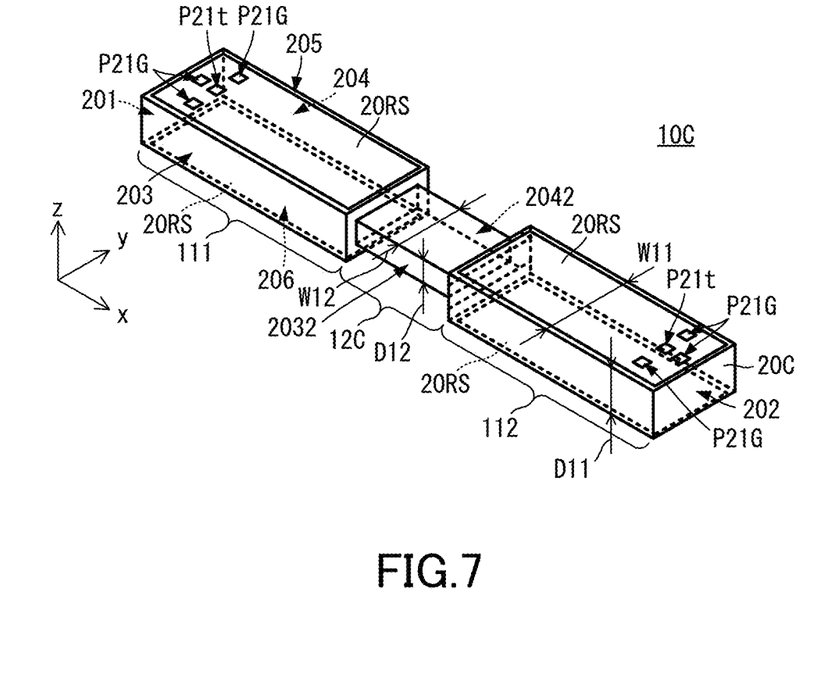
FIG. 7 is an external perspective view of a transmission line member according to a fourth preferred embodiment of the present invention.
Figure 8A:
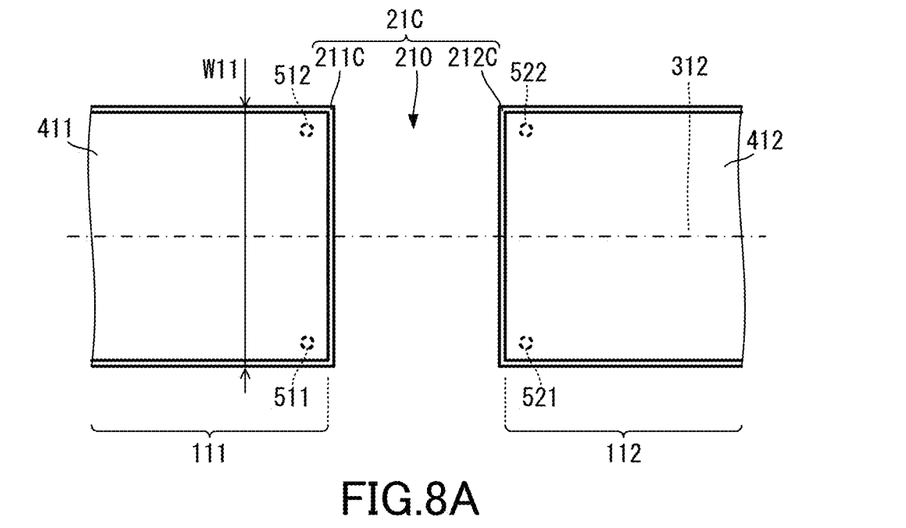
FIG. 8A is an enlarged side cross-sectional view of a region of the transmission line member according to the fourth preferred embodiment of the present invention including a second portion of a base material.
Figure 8B:
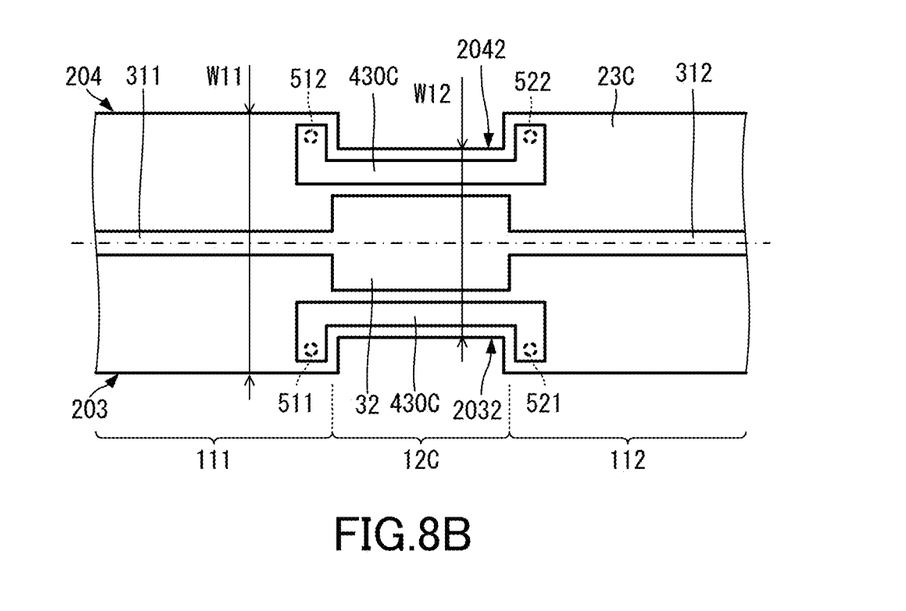
FIG. 8B is an enlarged plan view of the region of the transmission line member according to the fourth preferred embodiment of the present invention including the second portion of the base material.

A transmission line member according to a fourth preferred embodiment of the present invention will be described with reference to the drawings. FIG. 7 is an external perspective view of the transmission line member according to the fourth preferred embodiment. In FIG. 7, the thickness is exaggerated to facilitate the understanding of the configuration. FIG. 8A is an enlarged side cross-sectional view of a region including the second portion of the base material of the transmission line member according to the fourth preferred embodiment. FIG. 8B is an enlarged plan view of the region including the second portion of the base material of the transmission line member according to the fourth preferred embodiment.

As illustrated in FIG. 7 and FIGS. 8A and 8B, a transmission line member 10C according to the fourth preferred embodiment is different from the transmission line member 10 according to the first preferred embodiment in the structure of a second portion 12C. The remaining configurations of the transmission line member 10C are the same as or similar to those of the transmission line member 10, and the description of the similar portions will be omitted. Insulating resin layers 21C, 211C, and 212C in FIG. 8A respectively have the same or substantially the same configurations as the insulating resin layers 21, 211, and 212 according to the first embodiment.

As illustrated in FIG. 7 and FIG. 8B, the transmission line member 10C includes the second portion 12C. A width W12 of the second portion 12C is smaller than a width W11 of the first portion 111 and the third portion 112.

With this configuration, the transmission line member 10C is even more easily bent at the second portion 12C.

As illustrated in FIG. 8B, a ground conductor 430C is provided on the insulating resin layer 23C, protrudes in the first portion 111 and the third portion 112 by a predetermined length, and extends to the vicinity of the side surface 203 and the side surface 204. The ground conductor 430C includes the one extending distal end portion connected to the ground conductor 411 and the ground conductor 421 (not illustrated in FIGS. 8A and 8B) via the interlayer connection conductor 511 and the interlayer connection conductor 512. The ground conductor 430C includes another extending distal end portion connected to the ground conductor 412 and the ground conductor 422 (not illustrated in FIGS. 8A and 8B) via the interlayer connection conductor 521 and the interlayer connection conductor 522. Specifically, the ground conductor 430C is connected to the ground conductor 411, the ground conductor 412, the ground conductor 421, and the ground conductor 422 via the interlayer connection conductors in the first portion 111 or the third portion 112.

The interlayer connection conductor 511 and the interlayer connection conductor 521 are closer to the side surface 203 of the base body 20C than a side surface 2032 of the second portion 12C. The interlayer connection conductor 512 and the interlayer connection conductor 522 are closer to the side surface 204 of the base body 20C than a side surface 2042 of the second portion 12C.

With such a configuration, even when the second portion 12C is bent, the resultant bending stress is less likely to propagate to the interlayer connection conductor 511, the interlayer connection conductor 512, the interlayer connection conductor 521, and the interlayer connection conductor 522. Thus, the reliability of the transmission line member 10C is improved.

Fifth Preferred Embodiment

Figure 9:
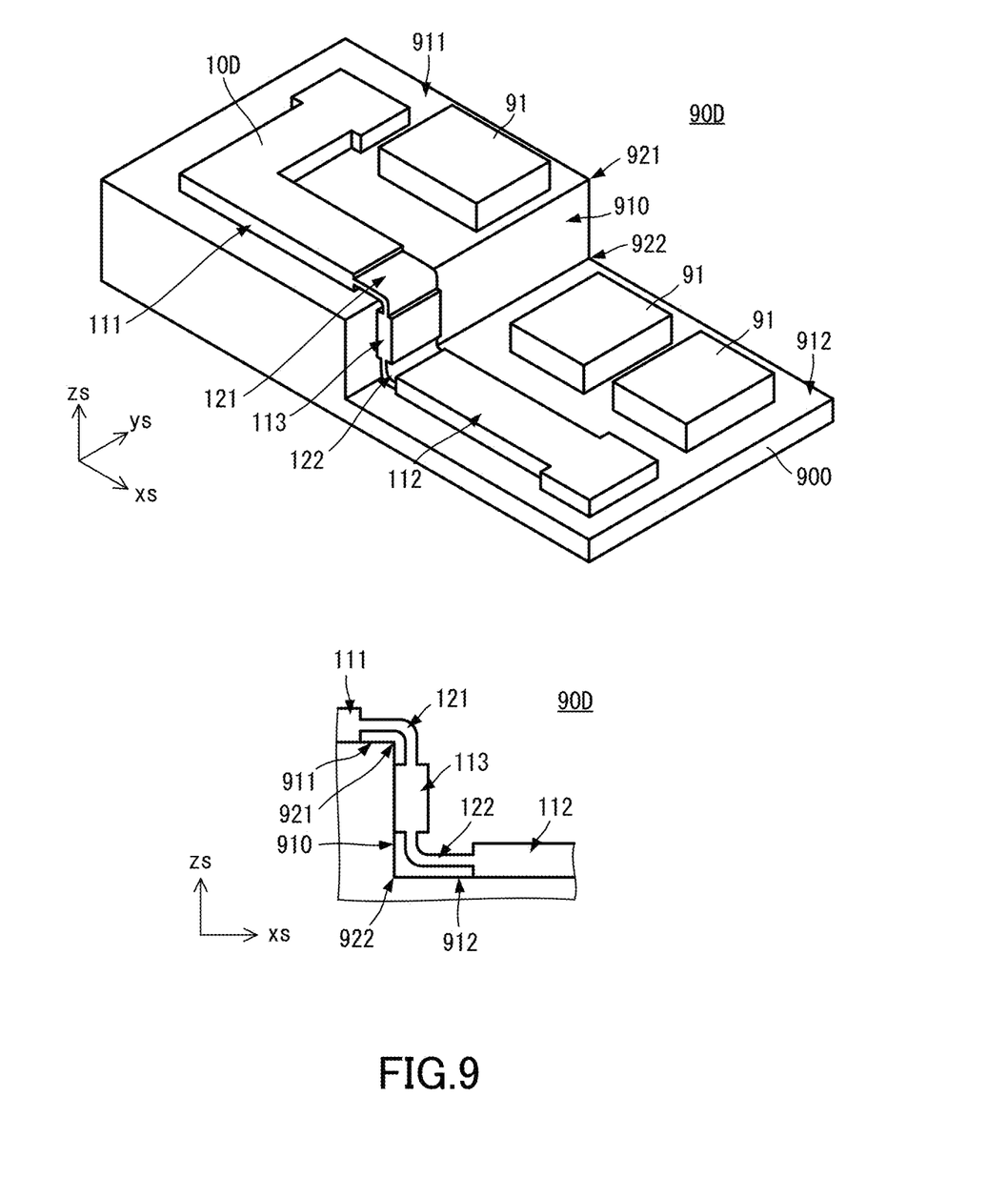
FIG. 9 is an external perspective view of a transmission line member and an electronic device according to a fifth preferred embodiment of the present invention.

A transmission line member and an electronic device according to a fifth preferred embodiment of the present invention will be described with reference to FIG. 9. FIG. 9 is an external perspective view of the transmission line member and the electronic device according to the fifth preferred embodiment.

As illustrated in FIG. 9, a transmission line member 10D according to the fifth preferred embodiment is different from the transmission line member 10 according to the first preferred embodiment in that a second portion 121, a second portion 122, and a sixth portion 113 are provided. The remaining configurations of the transmission line member 10D are the same as or similar to those of the transmission line member 10, and the description of the same or similar portions will be omitted. In addition, an electronic device 90D is different from the electronic device 90 in the configuration and arrangement of the transmission line member 10D. Remaining configurations of the electronic device 90D are the same as or similar to those of the electronic device 90, and description of the same or similar portions is omitted.

The transmission line member 10D has a configuration in which the first portion 111, the second portion 121, the sixth portion 113, the second portion 122, and the third portion 112 are connected along the extending direction. That is, the sixth portion 113 is provided between the second portion 121 and the second portion 122 (intermediate position).

The sixth portion 113 has the same or substantially the same structure as the first portion 111 and the third portion 112, and includes a stripline. The stripline in the sixth portion 113 corresponds to a "sixth transmission line".

The second portion 121 is bent along a corner portion 921 where the principal surface 911 and the step surface 910 intersect. The second portion 122 is bent along a corner portion 922 where the principal surface 912 and the step surface 910 intersect.

The sixth portion 113 is disposed along the step surface 910 such that a direction in which the sixth portion 113 is connected to the second portion 121 and the second portion 122 is parallel or substantially parallel to the step surface 910. In other words, the principal surface of the sixth portion 113 is orthogonal or substantially orthogonal to the principal surface of the first portion 111 and the principal surface of the third portion 112.

With such a configuration, even if there is a step on the circuit board 900, the transmission line member 10D can be easily mounted along the step surface 910. With the sixth portion 113 provided, the structure where the signal conductor is sandwiched between the ground conductors is achieved also in a portion parallel or substantially parallel to the step surface 910, such that unwanted radiation to the outside can be further reduced or prevented. Furthermore, with the thick sixth portion 113, unwanted deformation can be reduced or prevented.

Note that the configurations of the above-described preferred embodiments can be appropriately combined, and advantageous effects according to the respective combinations can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line member comprising:
   a base body extending along a transmission direction of a high-frequency signal; and
   a first transmission line, a second transmission line, and a third transmission in the base body and sequentially connected along the transmission direction; wherein
   the base body includes:
      a first portion in which the first transmission line is provided;
      a second portion in which the second transmission line is provided; and
      a third portion in which the third transmission line is provided;
   the first transmission line and the third transmission line include a first signal conductor;
   the second transmission line includes a second signal conductor;
   the second portion is connected between the first portion and the third portion;
   a thickness of the second portion is smaller than a thickness of the first portion and a thickness of the third portion;

the second transmission line is a coplanar line and includes only a conductor pattern extending more in the transmission direction than in a direction of the thickness; and a width of the second signal conductor is larger than a width of the first signal conductor.

2. The transmission line member according to claim 1, wherein the first transmission line and the third transmission line are each a stripline including;
    a first ground conductor and a second ground conductor separated from each other along a thickness direction of the base body;
    the first signal conductor between the first ground conductor and the second ground conductor; and
    an interlayer connection conductor connecting the first ground conductor and the second ground conductor to each other and extending in the thickness direction of the base body.

3. The transmission line member according to claim 2, wherein
    the second transmission line further includes:
        a third ground conductor; and
        a fourth ground conductor;
    the second signal conductor, the third ground conductor, and the fourth ground conductor are at predetermined positions in the thickness direction of the base body; and
    in the coplanar line, the second signal conductor is sandwiched between the third ground conductor and the fourth ground conductor in a width direction of the base body.

4. The transmission line member according to claim 2, wherein a distance between a side end portion of the interlayer connection conductor of the first portion closest to the second portion and a side end portion of the interlayer connection conductor of the third portion closest to the second portion is about ¼ or less of a wavelength of the high-frequency signal.

5. The transmission line member according to claim 2, further comprising:
    a fourth portion in which the second transmission line is connected to the first transmission line and a fifth portion in which the second transmission line is connected to the third transmission line; wherein
    the fourth portion and the fifth portion each include a microstripline including a third signal conductor and a fifth ground conductor separated from each other along the thickness direction of the base body.

6. The transmission line member according to claim 5, wherein
    a thickness of the fourth portion is smaller than the thickness of the first portion and larger than the thickness of the second portion; and
    a thickness of the fifth portion is smaller than the thickness of the third portion and larger than the thickness of the second portion.

7. The transmission line member according to claim 5, wherein a width of the third signal conductor is smaller than the width of the second signal conductor and larger than the width of the first signal conductor.

8. The transmission line member according to claim 1, wherein the second portion includes a hole extending in the direction of the thickness thereof and having a smaller thickness than the first portion and the third portion.

9. The transmission line member according to claim 1, wherein the second portion is bent in the thickness direction of the base body.

10. The transmission line member according to claim 9, wherein the second portion is bent in a plurality of different directions at a plurality of different positions.

11. The transmission line member according to claim 1, further comprising:
    a sixth portion including a sixth transmission line; wherein
    the sixth transmission line has a same or substantially a same structure as the first transmission line and the third transmission line; and
    the sixth portion is located at an intermediate position of the second portion.

12. The transmission line member according to claim 11, wherein a principal surface of the first portion orthogonal or substantially orthogonal to the direction of the thickness thereof and a principal surface of the third portion orthogonal or substantially orthogonal to the direction of the thickness thereof are orthogonal or substantially orthogonal to a principal surface of the sixth portion orthogonal or substantially orthogonal to the direction of the thickness thereof.

13. An electronic device comprising:
    a circuit board;
    the transmission line member according to claim 1 on the circuit board; and
    an electronic component on the circuit board.

14. The electronic device according to claim 13, wherein the first transmission line and the third transmission line are each a stripline including;
    a first ground conductor and a second ground conductor separated from each other along a thickness direction of the base body;
    the first signal conductor between the first ground conductor and the second ground conductor; and
    an interlayer connection conductor connecting the first ground conductor and the second ground conductor to each other and extending in the thickness direction of the base body.

15. The electronic device according to claim 14, wherein the second transmission line further includes:
    a third ground conductor; and
    a fourth ground conductor;
    the second signal conductor, the third ground conductor, and the fourth ground conductor are at predetermined positions in the thickness direction of the base body; and
    in the coplanar line, the second signal conductor is sandwiched between the third ground conductor and the fourth ground conductor in a width direction of the base body.

16. The electronic device according to claim 14, further comprising:
    a fourth portion in which the second transmission line is connected to the first transmission line and a fifth portion in which the second transmission line is connected to the third transmission line; wherein
    the fourth portion and the fifth portion each include a microstripline including a third signal conductor and a fifth ground conductor separated from each other along the thickness direction of the base body.

17. The electronic device according to claim 16, wherein
    a thickness of the fourth portion is smaller than the thickness of the first portion and larger than the thickness of the second portion; and
    a thickness of the fifth portion is smaller than the thickness of the third portion and larger than the thickness of the second portion.

18. The electronic device according to claim 16, wherein a width of the third signal conductor is smaller than the width of the second signal conductor and larger than the width of the first signal conductor.

* * * * *